United States Patent
Balb et al.

(10) Patent No.: US 12,334,172 B2
(45) Date of Patent: *Jun. 17, 2025

(54) LINK EVALUATION FOR A MEMORY DEVICE

(71) Applicant: Micron Technology, Inc., Boise, ID (US)

(72) Inventors: Markus Balb, Ottobrunn (DE); Thomas Hein, Munich (DE); Heinz Hoenigschmid, Poecking (DE)

(73) Assignee: Micron Technology, Inc., Boise, ID (US)

( * ) Notice: Subject to any disclaimer, the term of this patent is extended or adjusted under 35 U.S.C. 154(b) by 197 days.

This patent is subject to a terminal disclaimer.

(21) Appl. No.: 18/112,830

(22) Filed: Feb. 22, 2023

(65) Prior Publication Data

US 2023/0197181 A1 Jun. 22, 2023

Related U.S. Application Data

(63) Continuation of application No. 17/121,314, filed on Dec. 14, 2020, now Pat. No. 11,615,862.

(Continued)

(51) Int. Cl.
*G11C 29/44* (2006.01)
*G06F 3/06* (2006.01)
(Continued)

(52) U.S. Cl.
CPC .............. *G11C 29/44* (2013.01); *G06F 3/061* (2013.01); *G06F 3/0659* (2013.01);
(Continued)

(58) Field of Classification Search
CPC . G11C 29/44; G11C 29/023; G11C 29/12005; G11C 29/38; G11C 29/50012;
(Continued)

(56) References Cited

U.S. PATENT DOCUMENTS

| | | | |
|---|---|---|---|
| 8,730,758 B2 * | 5/2014 | Lee | ..................... G06F 13/1689 |
| | | | 365/233.5 |
| 9,177,623 B2 | 11/2015 | Pandey et al. | |

(Continued)

FOREIGN PATENT DOCUMENTS

KR      10-2019-0061529 A      6/2019

OTHER PUBLICATIONS

International Search Report and Written Opinion received for PCT Patent Application No. PCT/US20/65100, mailed on Apr. 9, 2021, 9 pages.

(Continued)

*Primary Examiner* — Huan Hoang
*Assistant Examiner* — Justin Bryce Heisterkamp
(74) *Attorney, Agent, or Firm* — Holland & Hart LLP

(57) ABSTRACT

Methods, systems, and devices for link evaluation for a memory device are described. A memory device may receive signaling over a channel and may identify logic values encoded into the signaling based on sampling the signaling against a reference voltage. The sampling may occur at a reference time within a sampling period. To evaluate a quality (e.g., margin of error) of the channel, the memory device may adjust the reference voltage, the reference time, or both, and either the memory device or the host device may determine whether the memory device is still able to correctly identify logic values encoded into signaling over the channel. In some cases, the channel quality may be evaluated during a refresh cycle or at another opportunistic time for the memory device.

20 Claims, 11 Drawing Sheets

Related U.S. Application Data

(60) Provisional application No. 62/950,851, filed on Dec. 19, 2019.

(51) Int. Cl.

| | | |
|---|---|---|
| *G06F 13/16* | (2006.01) | |
| *G06F 13/42* | (2006.01) | |
| *G11C 29/02* | (2006.01) | |
| *G11C 29/12* | (2006.01) | |
| *G11C 29/38* | (2006.01) | |
| *G11C 29/50* | (2006.01) | |
| *H04L 7/00* | (2006.01) | |
| *H04L 7/033* | (2006.01) | |

(52) U.S. Cl.
CPC ...... *G06F 13/1689* (2013.01); *G06F 13/4243* (2013.01); *G11C 29/023* (2013.01); *G11C 29/12005* (2013.01); *G11C 29/38* (2013.01); *G11C 29/50012* (2013.01); *H04L 7/0008* (2013.01); *H04L 7/033* (2013.01); *G06F 13/1694* (2013.01); *G11C 2207/2254* (2013.01)

(58) Field of Classification Search
CPC .......... G11C 2207/2254; G11C 29/021; G11C 29/028; G11C 29/14; G06F 3/061; G06F 3/0659; G06F 13/1689; G06F 13/4243; G06F 13/1694; H04L 7/0008; H04L 7/033

See application file for complete search history.

(56) References Cited

U.S. PATENT DOCUMENTS

| | | | |
|---|---|---|---|
| 9,960,902 B1* | 5/2018 | Lin | H04L 7/033 |
| 10,348,312 B1* | 7/2019 | Novellini | H04L 1/201 |
| 10,671,476 B2* | 6/2020 | Froelich | G06F 13/14 |
| 10,708,011 B2* | 7/2020 | Mao | H04L 1/203 |
| 11,270,745 B2* | 3/2022 | Chen | G11C 29/028 |
| 11,449,439 B1* | 9/2022 | Kariya | G06F 13/1668 |
| 11,615,862 B2* | 3/2023 | Balb | G11C 29/12005 |
| | | | 365/185.09 |
| 2005/0069031 A1 | 3/2005 | Sunter et al. | |
| 2005/0132158 A1 | 6/2005 | Hampel et al. | |
| 2016/0162426 A1* | 6/2016 | Benjamin | G11C 29/022 |
| | | | 710/118 |
| 2018/0095916 A1* | 4/2018 | Zerbe | G06F 13/364 |
| 2018/0122444 A1* | 5/2018 | Ware | G06F 13/4234 |
| 2019/0164594 A1* | 5/2019 | Eom | G11C 29/028 |
| 2020/0118609 A1* | 4/2020 | Brox | G06F 13/4086 |
| 2021/0027817 A1 | 1/2021 | Chen et al. | |
| 2022/0093161 A1 | 3/2022 | Eom et al. | |

OTHER PUBLICATIONS

Korean patent office, "KR Office Action," issued in connection with Korean Patent Application No. 10-2022-7023946 dated Oct. 31, 2024 (17 pages) (8 pages of English Translation and 9 pages of Original Document).

* cited by examiner

LINK EVALUATION FOR A MEMORY DEVICE

CROSS REFERENCE

The present Application for Patent is a continuation of U.S. patent application Ser. No. 17/121,314 by Balb et al., entitled "LINK EVALUATION FOR A MEMORY DEVICE," filed Dec. 14, 2020, which claims priority to U.S. Provisional Patent Application No. 62/950,851 by Balb et al., entitled "LINK EVALUATION FOR A MEMORY DEVICE," filed Dec. 19, 2019, each of which is assigned to the assignee hereof and each of which is expressly incorporated by reference in its entirety.

BACKGROUND

The following relates generally to one or more memory systems and more specifically to link evaluation for a memory device.

Memory devices are widely used to store information in various electronic devices such as computers, wireless communication devices, cameras, vehicles, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
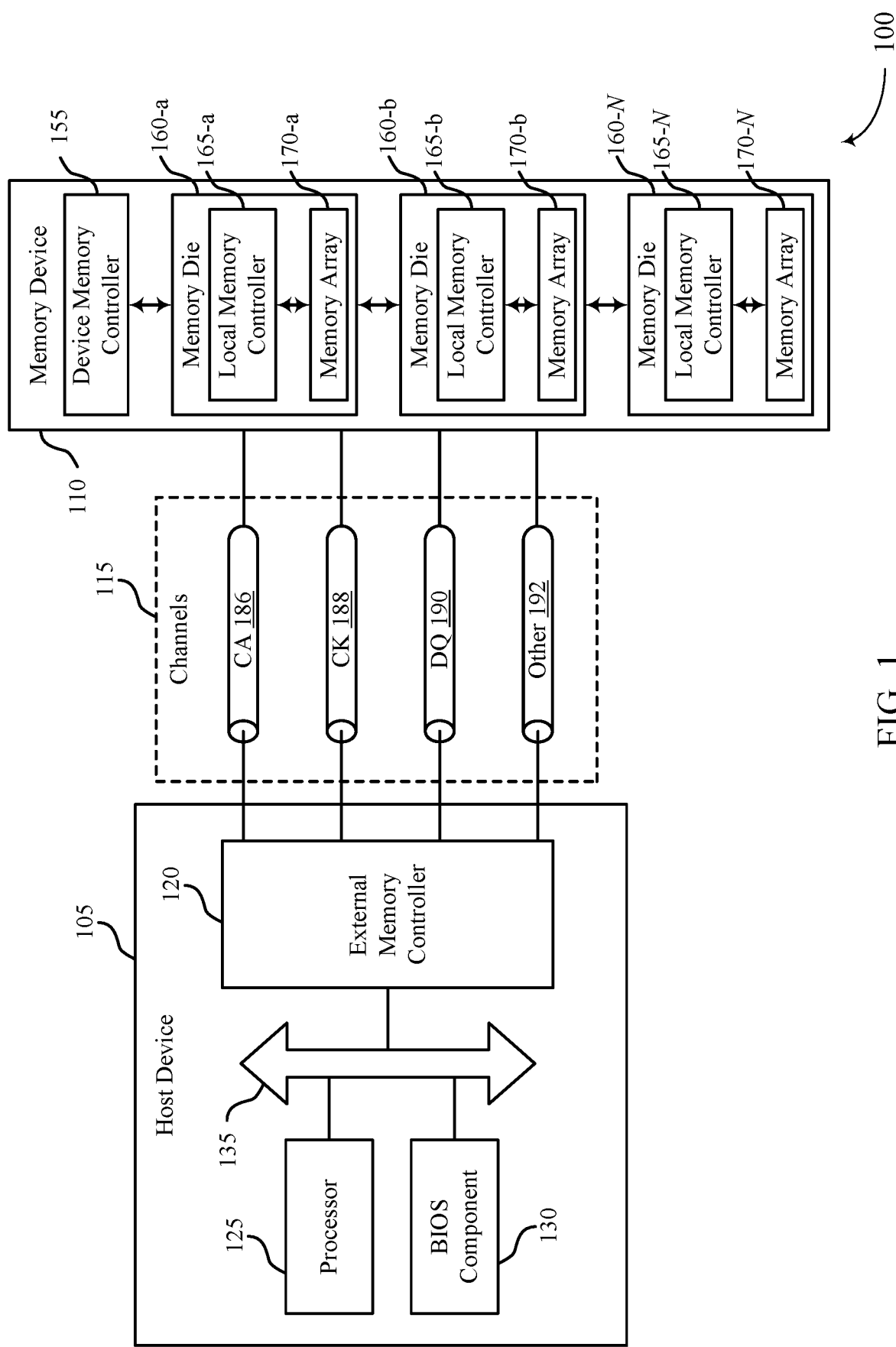
FIG. 1 illustrates an example of a system that supports link evaluation for a memory device in accordance with examples as disclosed herein.

In some cases, a memory device may receive data from a host device. The host device may transmit the data via a communications channel. The data may be transmitted as signals which may be sampled at the memory device. The memory device may sample a signal by measuring a voltage level of the signal during a unit interval (symbol period) to determine a logic state (e.g., a logic '0' or a logic '1') of the signal during the unit interval. The unit interval may have a duration that is defined by a clock associated with the transmission of the measured signal (e.g., a unit interval may have a duration equal to one period (cycle) or half of a period (cycle) of the clock, depending on whether single data rate (SDR) or double data rate (DDR) signaling is used).

To distinguish between different voltage levels when sampling a signal during a unit interval, a sampler at a memory device may compare the measured voltage level to a reference voltage at a time within the unit interval. The sampling time and the reference voltage may correspond to a reference point in a time and voltage domain (e.g., with the time domain corresponding to a duration of time used for sampling, which may align with or otherwise be based on the unit interval) and the voltage domain corresponding to a voltage swing (e.g., rail to rail difference) of the signal or channel), where the reference point may be determined or configured for the memory device. The sampler may accurately determine the logic state of the signal when the reference point used for sampling the signal falls within a data 'eye', which may refer to the space between signal traces corresponding to different logic states in the signal. The data eye may include an associated width (e.g., duration) in time and an associated opening (e.g., height, difference) between voltage levels. It may be beneficial to sample signals at the center of the data eye, to maximize the likelihood of the sampler accurately determining the logic state of the signal during the unit interval. The center of the data eye may refer to a reference point corresponding to a reference voltage that is halfway between a high voltage level associated with a first logic state (e.g., a logic '1') and a low voltage level associated with a second logic state (e.g., a logic '0') and a sampling time that is at a midpoint of the data eye.

In some examples, even if the memory device and the host device are exchanging data via a channel without related transmission or sampling errors, the channel may be deteriorating (e.g., a margin (separation, buffer) between the reference point of the sampler and an edge of the data eye may be shrinking in the time domain, the voltage domain, or both, and thus a margin of error for the channel may be deteriorating). For example, voltage transitions (e.g., rising or falling edges) of signaling via the channel (and thus the data eye) may be shifting to be earlier or later in time relative to the beginning and end of sampling periods for the channel (and thus within the time domain). Additionally or alternatively, voltage levels (e.g., maximum or minimum voltage levels) of signaling via the channel (and thus the data eye) may be increasing or decreasing in voltage (and thus within the voltage domain).

Sampling a signal at a reference point that is different from the center of the data eye may increase the likelihood of incorrectly decoding (interpreting) received signals, and thus incorrectly determining the information encoded into the signaling (e.g., data errors), especially if the difference in time or voltage between the center of the data eye and the reference point is significant (e.g., above a threshold). In some systems and devices, when errors are detected, the host device or the memory device may attempt to recalibrate the channel. For example, the host device may adjust a reference clock (or otherwise adjust the timing of a clock signal for the channel) or recalibrate signaling (e.g., increase or decrease a delay in the signal path, or a voltage level associated with a driver for the signaling) before transmitting to the memory device, or the memory device may adjust sampling procedures (e.g., adjust an associated reference point) for received data. Such techniques, however, are reactive. To proactively avoid errors, it may be beneficial to determine a status (e.g., margin of error, quality, robustness) of the channel prior to an error or additional errors occurring. For example, it may be beneficial to determine a margin of error associated with a configured reference point (e.g., a distance in the time domain, voltage domain or both, between the reference point used for sampling signaling over a channel and the data eye for the signaling).

Techniques are described herein which may enable a memory device or a host device to determine a margin of error associated with a channel between the memory device and the host device. The memory device may receive signaling including a sequence of logic values from the host device via the channel. The memory device may sample the signaling at one or more reference points in the time and voltage domain to obtain a candidate sequence of logic values. For example, the memory device may use reference points that are earlier and later in the time domain, higher or lower in the voltage domain, or both, to determine whether signaling may be accurately decoded at the adjusted reference points.

In some examples, the memory device may compare the candidate sequence to the sequence to determine a margin of error. For example, if the memory device is able to correctly decode the sequence (and thus the candidate sequence matches the sequence) using an adjusted reference point that is shifted in voltage or in time relative to the reference point used to decode operational information, such as user data (which may be referred to as the ideal, default, or operational reference point), then the margin of error for the channel may be determined as being at least as large in the time or voltage domain as the difference between the adjusted reference point and the ideal reference point. Additionally or alternatively, the memory device may transmit to the host device the candidate sequence as decoded by the memory device, and the host device may compare the candidate sequence to the sequence as transmitted by the host device to determine the margin of error. Based on the margin of error, the host device may take corrective or mitigating action, such as instructing the memory device to calibrate a sampler (e.g., adjust a reference point used by the sampler) to improve sampling of subsequent data transmissions from the host device.

Features of the disclosure are initially described in the context of memory systems and dies as described with reference to FIGS. 1 and 2. Features of the disclosure are then described in the context of a memory system, and eye diagram, and a process flow as described with reference to FIGS. 3-5. These and other features of the disclosure are further illustrated by and described with reference to apparatus diagrams and flowcharts that relate to link evaluation for a memory device as described with references to FIGS. 6-11.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller. In some examples, the system 100 may include a channel between an I/O controller of the host device 105 and an I/O controller of the memory device 110.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-*a*, local memory controller 165-*b*, local memory controller 165-N) and a memory array 170 (e.g., memory array 170-*a*, memory array 170-*b*, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160. In some examples, the device memory controller 155 may include or be coupled with the I/O controller of the memory device 110.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, information may be communicated over the channels 115 using SDR signaling or DDR signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the channels 115 may include one or more command and address (CA) channels 186. The CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, the channels 115 may include one or more clock signal channels 188 (e.g., CK channels). The clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. For example, signals received over other channels 115 (e.g., CA channels 186, DQ channels 190) may be sampled based on the edges of the system clock signal. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, the channels 115 may include one or more data (DQ) channels 190. The data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include signaling which may be sampled by a sampler at the memory device 110. The sampler may sample the signaling by measuring a voltage level of the signal during a unit interval to determine a logic state (e.g., a logic '0' or a logic '1') of the signal during the unit interval. The unit interval may be defined by a clock associated with the transmission of the measured signal (e.g., the unit interval may span a duration of time during which a rising or falling edge of the clock occurs). The sampler may compare the measured voltage level to a reference voltage at a sampling time, where the reference voltage and the sampling time may correspond to a reference point in the time and voltage domain.

In some cases, the memory device 110 may receive, over a channel 115 being evaluated, signaling including a sequence of logic values from the host device 105. The sequence of logic values may be preconfigured or otherwise comprise logic values known a priori to the memory device 110. The memory device 110 may sample the signaling at one or more reference points in the time and voltage domain to obtain a candidate sequence of logic values. In some cases, the memory device 110 may include multiple samplers to concurrently sample the signaling at multiple reference points. In other cases, the host device 105 may transmit the sequence repeatedly, and the memory device 110 may sample each instance of the sequence using the same sampler but with a different (reconfigured) reference point. For each candidate sequence determined by the memory device 110, the memory device 110 may compare the candidate sequence to the sequence to determine a margin of error. Additionally or alternatively, the memory device 110 may transmit the candidate sequence to the host device 105, and the host device 105 may compare the candidate sequence to the transmitted sequence to determine the margin of error. Based on the margin of error, the host device 105 may instruct the memory device 110 to calibrate a sampler or may take other corrective action to improve sampling of subsequent data transmissions from the host device 105.

The channels 115 may each include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
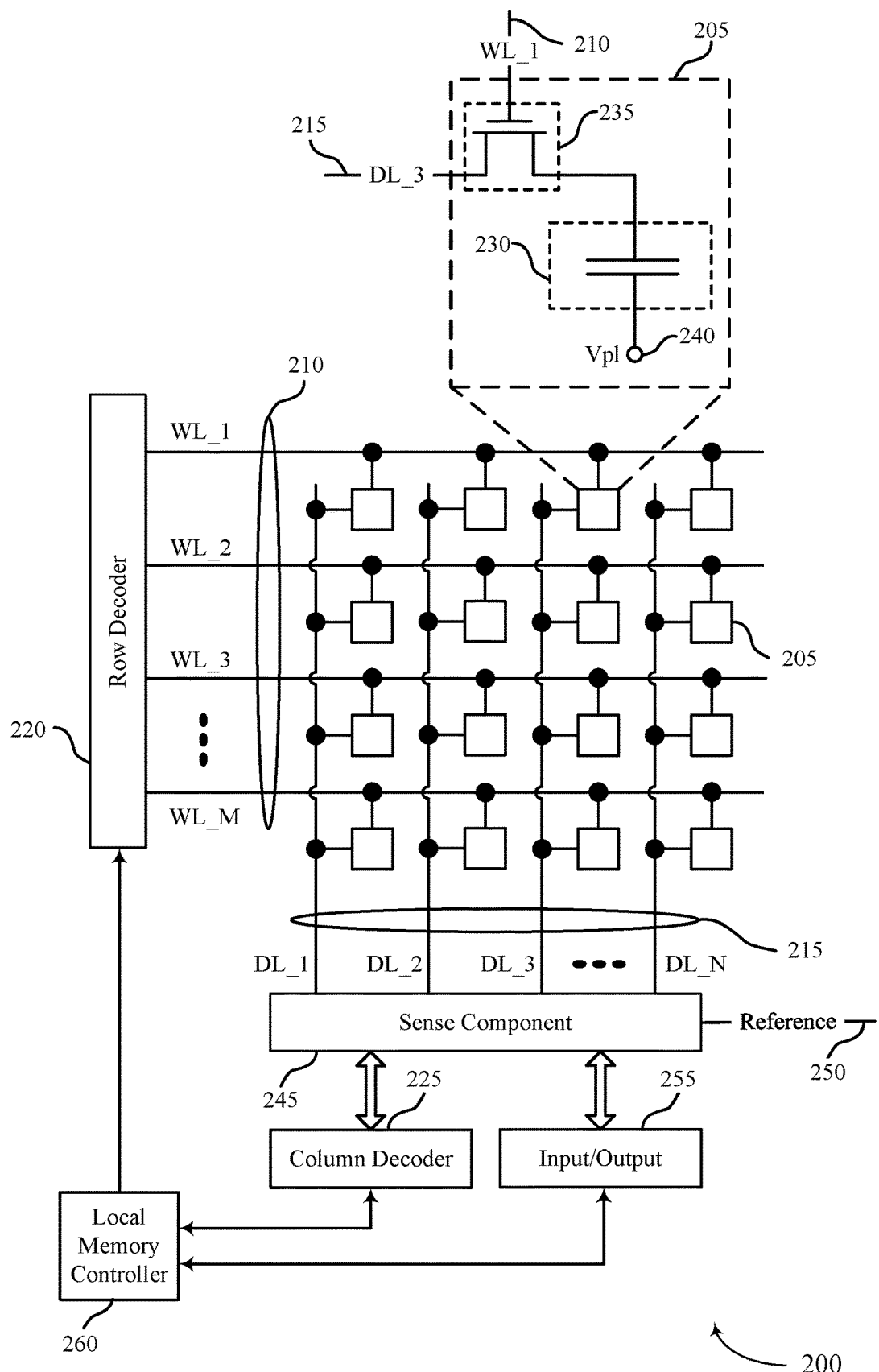
FIG. 2 illustrates an example of a memory die that supports link evaluation for a memory device in accordance with examples as disclosed herein.

FIG. 2 illustrates an example of a memory die 200 in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11).

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

In some examples, the local memory controller 260 may include or be coupled with one or more samplers, each operable to sample signaling received via a channel 115 in order to identify commands, data, or other information encoded in the signaling. The local memory controller 260 may be configured to support a link evaluation by determining a margin of error associated with a channel between the host device 105 and the memory die 200. A sampler may sample signaling including a sequence of logic values received from the host device 105 and thereby obtain a candidate sequence of logic values. In some examples, the local memory controller 260 may compare the candidate sequence to the sequence to determine a margin of error. Additionally or alternatively, the local memory controller 260 may transmit the candidate sequence to the host device 105, and the host device 105 may compare the candidate sequence to the sequence to determine the margin of error. Based on the margin of error, the host device 105 may instruct the local memory controller 260 to calibrate the sampler to improve sampling of subsequent data transmissions from the host device 105.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Figure 3:
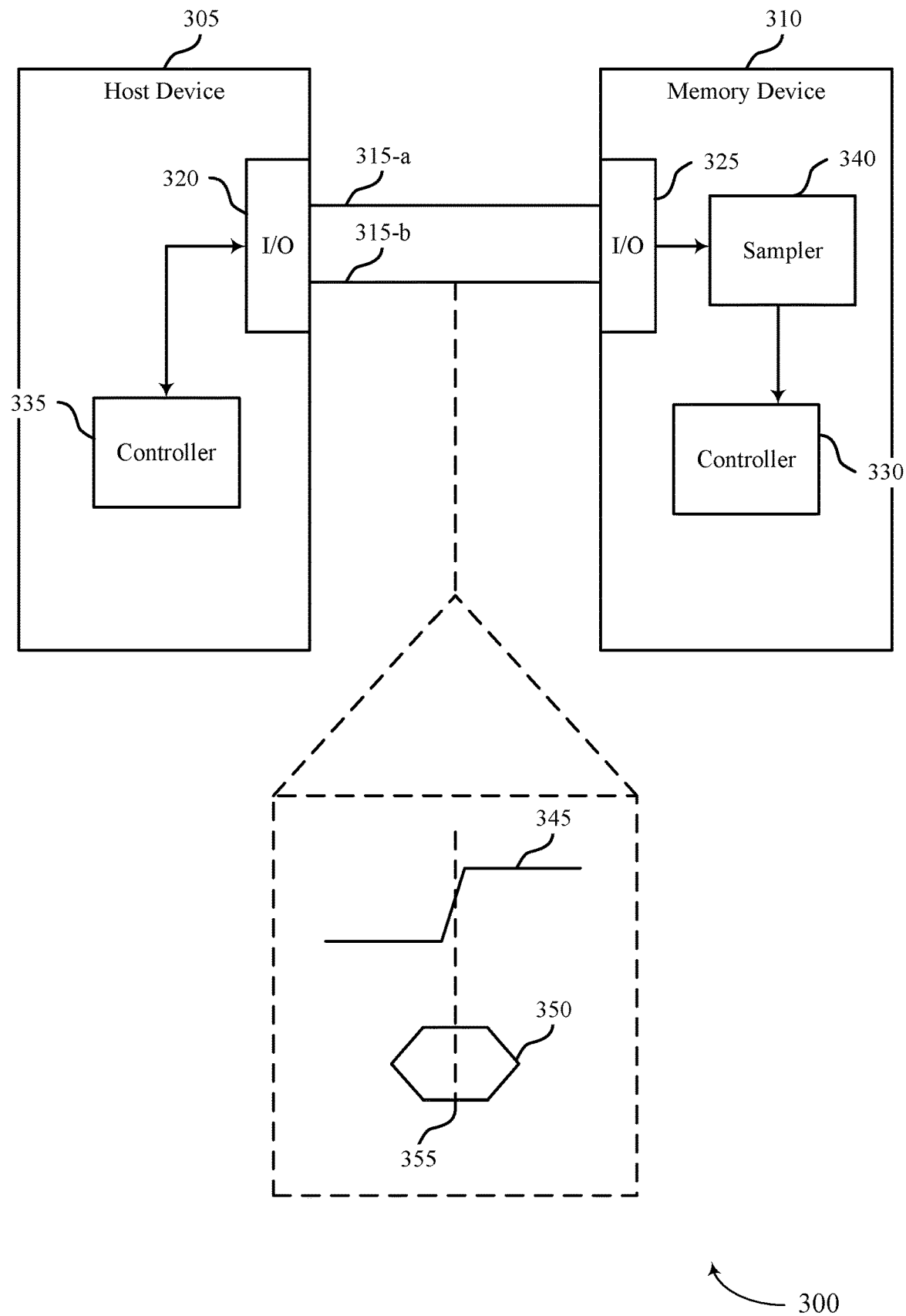
FIG. 3 illustrates an example of a memory system that supports link evaluation for a memory device in accordance with examples as disclosed herein.

FIG. 3 illustrates an example of a memory system 300 that supports link evaluation in accordance with examples as disclosed herein. The memory system 300 may include a host device 305 and a memory device 310, which may be examples of corresponding devices described with reference to FIG. 1.

Components of the host device 305 may exchange information with the memory device 310 using one or more channels 315, which may be examples of channels 115 as described above. For example, an I/O component 320 of the host device 305 may transmit instructions (commands) via a channel 315-a to an I/O component 325 of the memory device 310. For example, the channel 315-a may be a CA channel 186 as described with reference to FIG. 1. Additionally, a channel 315-b may be operable to support communications between a memory controller 335 at the host device 305 and the memory device 110. The channel 315-b may communicate data information between the host device 305 and the memory device 310. For example, the channel 315-b may be a DQ channel 190 as described with reference to FIG. 1 and communicate information (e.g., bi-directionally) to be written to the memory device 310 or information read from the memory device 310.

The memory device 310 may receive signaling including (encoded with) logic values from the host device 305 via the channel 315-b. In some examples, the memory device 310 may identify a purpose of the logic values (e.g., data to be written to a memory array, or a test sequence for evaluating a condition of the channel 315-b) based on instructions received at the I/O component 325. To determine the encoded logic states, the memory device 310 may sample the signaling on the channel 315-b at one or more reference points in the time and voltage domain using a sampler 340. The sampler 340 may sample the signaling on one or both of a rising edge and a falling edge of a clock signal 345 based on the type of signaling (e.g., SDR or DDR signaling). As illustrated in FIG. 3, the sampler 340 may sample the signaling on the rising edge of the clock signal 345 at a time 355.

At the time 355, the sampler 340 may measure the voltage level of the signaling and compare the measured voltage level to a reference voltage to determine a logic value (e.g., a logic '0' or a logic '1') at the time 355. During normal operation (e.g., when decoding data for storage to the memory device 310 or commands issued by the host device 305, the time 355 and the signaling via the channel 315-b may be configured such that the signaling is sampled near the middle of a unit interval (or another reference point previously as corresponding to the middle of the data eye) so as to avoid errors in determining logic states of the signaling. Similarly, the reference voltage may be configured such that the reference voltage is halfway between a first voltage level corresponding to a first logic value and a second voltage level corresponding to a second logic value. The time 355 and the reference voltage may, in conjunction, comprise a reference point used by the sampler, and the reference point used during normal operation may be referred to as a default, ideal, or operational reference point.

Based on the sampling, a memory controller 330 or other components of the memory device 310 (e.g., row or column decoders) coupled with the sampler 340 and the I/O component 325 may obtain logic values—that is, the sampler 340 may output logic values that were encoded in the sampled signaling by the host device 305. Though one sampler 340 is shown in the example of FIG. 3, in some examples, as described further with reference to FIG. 4 and elsewhere herein, the memory device 310 may include multiple samplers 340 to concurrently sample the signaling at multiple reference points.

Figure 4:
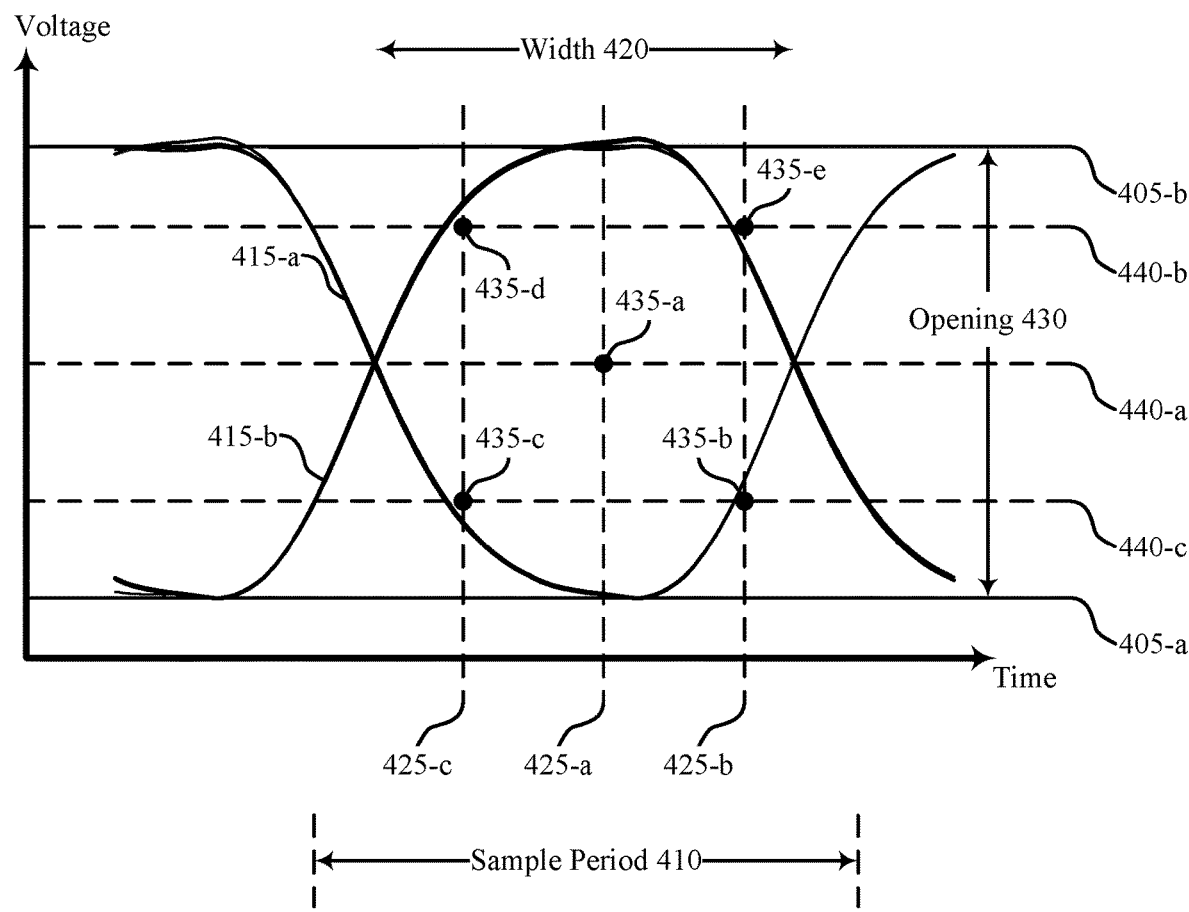
FIG. 4 illustrates an example of an eye diagram that supports link evaluation for a memory device in accordance with examples as disclosed herein.

FIG. 4 illustrates an example of an eye diagram 400 that supports link evaluation in accordance with examples as disclosed herein. The eye diagram 400 may depict overlaid data transmissions from different unit intervals within a time domain corresponding to a duration of each unit interval (or other sampling period, which may alternatively be referred to as a sample period) and may illustrate the behavior or operation of aspects of the system 100, the memory die 200, and the memory system 300 as described with reference to FIGS. 1-3. Thus, eye diagram 400 illustrates behavior and operations that may occur across any number of unit intervals.

For instance, the eye diagram 400 may indicate the quality of signals and may represent the different possible logic values that may be encoded into a signal (e.g., a logic '0' or a logic '1'). Each logic value may be represented by a different voltage amplitude (e.g., voltage levels 405-a and 405-b). The eye diagram 400 may provide a visual indication of the health and integrity of a signal. In the present example, the eye diagram 400 illustrates two distinct voltage levels 405 (e.g., a first voltage level 405-a and a second voltage level 405-b) that may ideally be communicated via a data channel. In some examples, the eye diagram 400 may represent a binary-level signal (e.g., an NRZ signal) that may be used to communicate data in a memory device (such as a memory device 110 as described with reference to FIG. 1). In addition, the binary-level singling represented by the eye diagram 400 may correspond to data transmissions over an unterminated transmission line. For instance, NRZ signaling may be transmitted over a channel without an active termination. Though the eye diagram 400 may represent a signal modulated according to a scheme that includes two voltage levels 405 (e.g., a binary-level signal), it is to be understood that the principles and techniques herein may be extended to modulation schemes using any number of voltage levels.

The eye diagram 400 may span a sample period 410 (e.g., a unit interval or a bit period). The sample period 410 may be defined based on a clock associated with the transmission of the measured signal (e.g., the sample period 410 may span one cycle or period of the clock). The eye diagram 400 may show the voltage levels of the signal during a number of sample periods 410, overlaid with one another to form traces 415. Noise and other factors may result in the traces 415 deviating from a set of ideal step functions. By overlaying multiple traces 415, various characteristics about the measured signal may be illustrated. For example, the eye diagram 400 may illustrate different characteristics of a communication signals such as jitter, cross talk, distortion, electromagnetic interference (EMI), signal loss, signal-to-noise ratio (SNR), other characteristics, or combinations thereof. A closed eye may indicate a noisy and/or unpredictable signal.

An 'eye' of the eye diagram 400 may refer to the space between the traces 415 and may include a width, such as width 420, and an opening, such as opening 430. With respect to the eye diagram 400, as the signals converge toward one of the voltage levels 405-a and 405-b, the areas between the voltage levels 405-a and 405-b that are devoid of traces 415 may thus be referred to as an eye of the eye diagram 400. Various encoding and decoding techniques may be used to modify the width 420 of the measured signal.

To distinguish between different voltage levels 405 when decoding a signal, respective reference voltages 440 may be located between the different ideal voltage levels 405 associated with the traces 415. The difference between voltage level 405-b (a maximum expected or ideal maximum voltage) and voltage level 405-a (a minimum expected or ideal minimum voltage) may be referred to as a voltage swing of the signal. Reference voltage 440-a may be equidistant from voltage level 405-b and voltage level 405-a, and thus may represent an example of an ideal reference voltage corresponding to a center of the data eye. When decoding user data (data for storing in a memory array) or commands, the signals represented by the traces 415 may be compared to the reference voltage 440-a at a sampling time 425. For example, a sampling time 425-a may occur near the middle of the sample period 410, which may correspond to the temporal center of the data eye. A reference point 435 within a time and voltage domain (e.g., the time domain thereof corresponding to a sampling period 410, and the voltage domain thereof corresponding to a voltage swing) may represent a combination of a reference voltage 440 and a sampling time 425. For example, a reference point 435-a may represent an ideal reference point 435 corresponding to the center of the data eye and thus corresponding to reference voltage 440-a at sampling time 425-a.

The nearer a reference point 435 is to an edge of the data eye, the more likely that errors may occur when decoding a signal represented by the data eye. In operation, the data eye for signaling over a channel may vary, for example, due to cross coupling, noise, unstable voltages, and the like. For example, an error (e.g., an incorrect value) may thus be detected if a signal meant to convey the logic value associated with first voltage level 405-a is above the reference voltage 440 used by a sampler 340 when a sampling time 425 occurs. As a result, the receiver may determine that the logic value associated with second voltage level 405-b was signaled, even though the logic value associated with first voltage level 405-a was intended.

As described herein, in order to avoid or mitigate (e.g. reduce the likelihood or rate of occurrence of) transmission or decoding errors, a device (e.g., a memory device 110 or a host device 105 as described with reference to FIG. 1) may determine a margin of error (e.g., buffer, separation from an edge of the data eye diagram 400 in the time or voltage domain) associated with the operational reference point 435 used by a sampler 340. A memory device may receive signaling including a sequence of logic values (which may be referred to as test signaling including a test sequence of logic values) from a host device via a channel. In some examples, the memory device may sample the signaling at an adjusted reference point 435 in each sample period 410 to determine the margin of error. The memory device may adjust the reference point 435 by adjusting the reference voltage 440 or adjusting the sampling time 425. For example, the memory device may adjust a phase interpolator for the sampler, or the memory device may adjust a delay quantity in a signal path of the sampling clock. Example adjusted reference points 435 may include reference points 435-b, 435-c, 435-d and 435-e. The reference point 435-b may correspond to a sampling time 425-b and a reference voltage 440-c, the reference point 435-c may correspond to a sampling time 425-c and the reference voltage 440-c, the reference point 435-d may correspond to the sampling time 425-c and a reference voltage 440-b, and the reference point 435-e may correspond to the sampling time 425-b and the reference voltage 440-b. By sampling the test signaling at an adjusted reference point 435, and determining whether logic values determined by such sampling match expected (e.g., previously indicated, preconfigured, or otherwise known) logic values for the test signaling, the memory device may determine a margin of error associated with the channel over which the test signaling is received.

In a first example, the memory device may determine to sample the signaling represented by the eye diagram 400 at the reference point 435-d. That is, in each sample period 410 spanned by the signaling, the memory device may sample the signaling at the sampling time 425-c and compare the signals to the reference voltage 440-b to determine a logic value corresponding to the sample period 410. The memory device may sample the signaling at the reference point 435-d during successive sampling periods 410 in order to determine a candidate sequence of logic values. In some examples, the memory device may compare the candidate sequence to an expected sequence of logic values. Additionally or alternatively, the memory device may transmit the candidate sequence to the host device, and the host device may compare the candidate sequence to the expected sequence.

In the example illustrated in FIG. 4, the reference point 435-d is within the data eye of the eye diagram 400, and so the candidate sequence of logic values may match the expected sequence of logic values. Based on the comparison, the memory device (or the host device) may determine a margin of error for the channel carrying the signaling. The margin of error may be determined to be at least as large as a difference in the time domain and a difference in the voltage domain between the reference point 435-a and the reference point 435-d. For example, the difference in the time domain may correspond to a difference between the sampling time 425-a and the sampling time 425-c, and the difference in the voltage domain may correspond to a difference between the reference voltage 440-a and the reference voltage 440-b. In the example of the reference point 435-d, the margin of error may include a negative difference in the time domain, and a positive difference in the voltage domain.

In a second example, the memory device may determine to sample the signaling represented by the eye diagram 400 at the reference point 435-b. That is, in each sample period 410 spanned by the signaling, the memory device may sample the signaling at the sampling time 425-b and compare the signals to the reference voltage 440-c to determine a logic value corresponding to the sample period 410. The memory device may sample the signaling at the reference point 435-b during successive sampling periods 410 in order to determine a candidate sequence of logic values. The candidate sequence may be compared to the expected sequence.

In the example illustrated in FIG. 4, the reference point 435-b is outside the data eye of the eye diagram 400, and so one or more errors (e.g., incorrectly decoded values, mismatches) may be detected in the candidate sequence of logic values based on the comparison. For example, a logic value represented by a trace 415-a (e.g., a logic '0') may be incorrectly detected as a logic value represented by a trace 415-b (e.g., a logic '1'). Based on the comparison of sequences, the margin of error may be determined to be smaller than a difference in the time domain and a difference in the voltage domain between the reference point 435-a and the reference point 435-b. For example, the difference in the time domain may correspond to a difference between the sampling time 425-a and the sampling time 425-b, and the difference in the voltage domain may correspond to a difference between the reference voltage 440-a and the reference voltage 440-c. In the example of the reference point 435-b, the margin of error may include a positive difference in the time domain, and a negative difference in the voltage domain.

In some examples, the memory device may include multiple samplers, which may enable the memory device to sample the signaling at multiple reference points 435 in each sample period 410. For example, in addition to sampling the signal at the reference point 435-a, the memory device may additionally sample the signal at the adjusted reference points 435-d and 435-b as described in the first and second examples, as well as at the adjusted reference points 435-a and 435-c. Additionally or alternatively, the host device may transmit signaling including multiple repetitions of the sequence of logic values (that is, multiple instances of the test signaling), and the memory device may sample the signaling at a different reference point 435 during each repetition. Based on sampling the signaling at multiple reference points 435, a margin of error for the channel may be determined with a positive and negative difference in each of the time domain and the voltage domain. It is to be understood that the memory device may sample the signaling at any number of adjusted reference points 435 (not shown) to obtain an estimate of the margin of error at any desired granularity and in any number of directions and domain.

The memory device or the host device may determine whether the margin of error exceeds a threshold (e.g., whether the margin of error in one or more directions and domains exceeds a respective threshold). If the margin of error exceeds the threshold, the margin of error may be determined to be tolerable for operation of the channel. If the margin of error does not exceed the threshold (e.g., if some threshold number, such as one, of the margins of error in different directions and thresholds is below its respective threshold), the memory device or the host device may determine to take steps to improve communications on the channel. For example, the memory device or the host device may determine to initiate a recalibration procedure for one or more samplers at the memory device to improve sampling of subsequent data transmissions from the host device.

Figure 5:
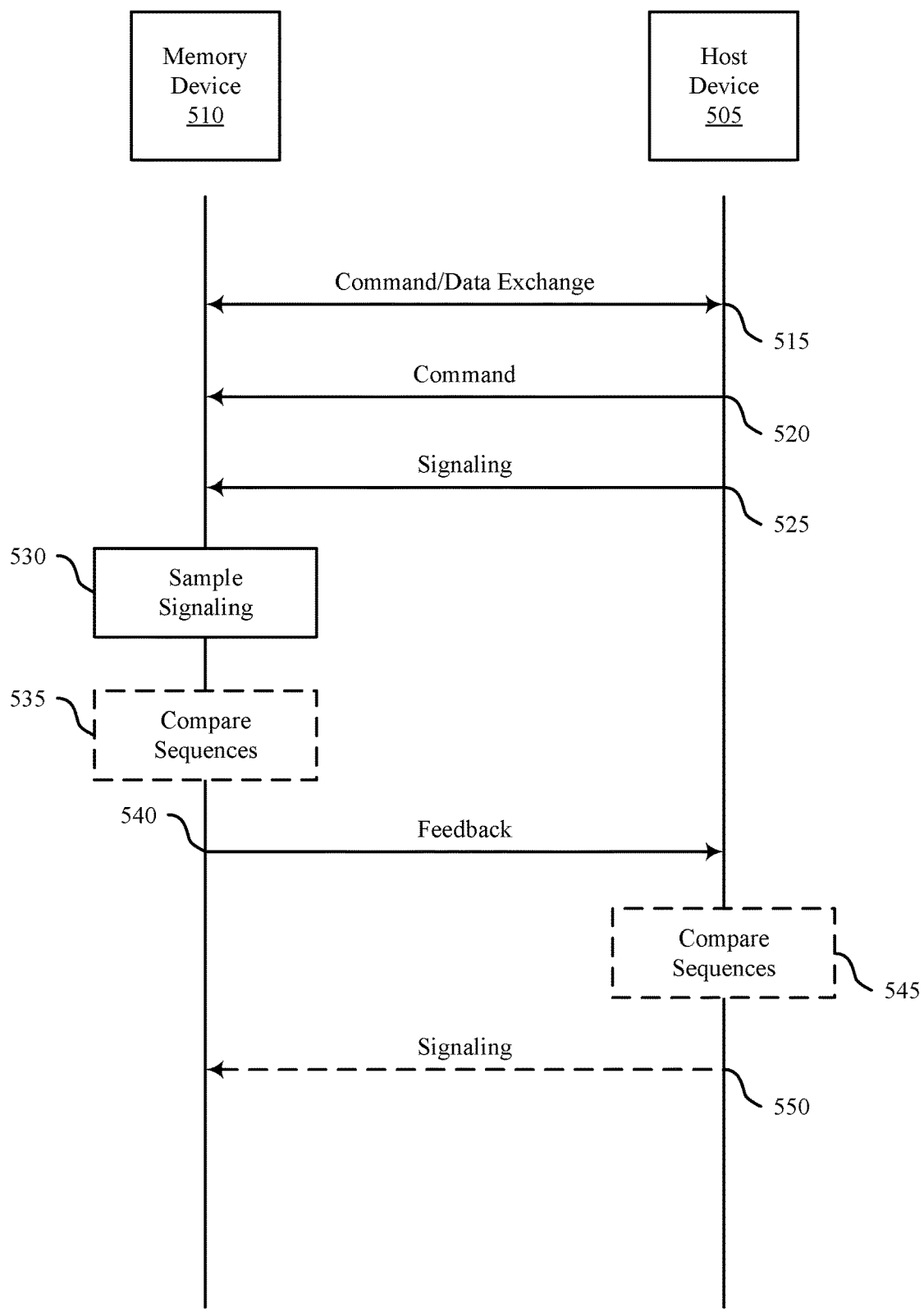
FIG. 5 illustrates an example of a process flow that supports link evaluation for a memory device in accordance with examples as disclosed herein.

FIG. 5 illustrates an example of a process flow 500 that supports link evaluation in accordance with examples as disclosed herein. In some examples, the process flow 500 may illustrate implementation of aspects of the system 100, the memory die 200, and the memory system 300 as described with reference to FIGS. 1-3. For example, the process flow 500 may include example transmissions or operations associated with one or more of a host device 505 and a memory device 510, which may be examples of the corresponding devices described with reference to FIGS. 1-3. In the following description of the process flow 500, the transmissions between the host device 505 and the memory device 510 may be transmitted in a different order than the example order shown, or the operations performed by the host device 505 and the memory device 510 may be performed in different orders or at different times. Some transmissions or operations may also be omitted from the process flow 500, and other transmissions or operations may be added to the process flow 500. The transmissions and operations performed by the host device 505 and the memory device 510 may support improvement to the memory device 510 operations and, in some examples, may promote improvements to the memory device 510 reliability, among other benefits.

At 515, the host device 505 and the memory device 510 may exchange commands and data. The commands and data may be exchanged via one or more channels (e.g., the channels 115 described with reference to FIG. 1). The commands and data may correspond to read or write operations at the memory device 510. For example, the host device 505 may transmit signaling to the memory device 510 corresponding to read or write operations. The memory device 510 may sample (e.g., using a sampler) the signaling to determine logic values (e.g., a logic '0' or a logic '1'). For example, within a unit interval of the signaling, the memory device may measure a voltage level of the signaling at a sampling (reference) time and compare the measured voltage level to a reference voltage to determine a logic value associated with the unit interval. The sampling time may be configured such that the signaling is sampled near the middle of the unit interval so as to avoid errors in determining logic states of the signaling. Similarly, the reference voltage may be configured such that the reference voltage is halfway between a first voltage level corresponding to a first logic value and a second voltage level corresponding to a second logic value.

At 520, the host device 505 may transmit a command to the memory device 510 to initiate a link evaluation. The command may be transmitted via a CA channel or another channel. In some examples, the command may be an autorefresh command for the memory device 510. For example, during a time period subsequent to the autorefresh command, the memory device 510 may refresh memory cells within a memory array at the memory device 510 while a link evaluation is performed for one or more channels between the host device 505 and the memory device 510.

In some examples, the command may indicate or include a sequence of logic values that are to be transmitted to the memory device 510 as part of the link evaluation. In other examples, the sequence of logic values may be preconfigured (e.g., standardized) at the memory device 510 or have been previously signaled to the memory device 510.

In some examples, the command may indicate the memory device is to activate one or more samplers for performing the link evaluation. In other examples, the memory device may perform the link evaluation using one sampler, and the sequence of logic values may be transmitted once or more than once (with different instances of the sequence sampled one after the other using different reference points).

At 525, the host device 505 may transmit signaling (e.g., test signaling) include the sequence of logic values to the memory device 510. In some examples, the memory device 510 may identify the signaling at 525 based on the command received at 520. For example, the memory device 510 may identify the signaling based on a timing relationship between the command and the signaling. The sequence of logic values may include a test sequence for performing the link evaluation. The sequence of logic values may be transmitted one or more times.

At 530, the memory device 510 may sample the signaling to determine, for each instance of the sequence of logic values, a corresponding candidate sequence of logic values. The memory device 510 may sample the signaling using one or more reference points, for example using the one or more samplers. In some examples, multiple reference points may be sampled concurrently, or the memory device 510 may sample different repetitions of the sequence of logic values at different reference points to determine multiple candidate sequences.

In some examples, at 535 the memory device 510 may compare the one or more candidate sequences to the sequence of logic values to determine a margin of error (or multiple margins of error, each corresponding to a respective direction and domain). For example, the memory device 510 may compare each of the values detected at the multiple reference points to a corresponding expected value. In some examples, the memory device 510 may make a pass or fail determination for a margin of error based on a threshold. For example, the memory device 510 may determine the margin of error is acceptable if the margin of error is above the threshold, or the memory device 510 may determine the margin of error is unacceptable if the margin of error is below a threshold. In some cases, the threshold may equal the difference between an adjusted reference point and an ideal reference point (e.g., in a direction and domain), and thus any mismatch between a candidate sequence based on the adjusted reference point and the expected sequence may indicate a margin of error below the threshold. Alternatively, the threshold may be less than the difference between an adjusted reference point and an ideal reference point (e.g., in a direction and domain). In some cases, the threshold may correspond to an estimated variability of the reference point. For example, based on changing conditions associated with the sampler or the signal, the reference point may be different (e.g., use a different reference voltage, a different sampling time, or both) in different sampling periods. If the margin of error is above the threshold, the memory device 510 may successfully receive data without errors resulting from the variability of the reference point.

In some examples, the memory device 510 may determine multiple margins of error based on the sampling (e.g., in multiple domains, directions, or both). For example, the memory device 510 may determine a margin of error associated with the sampling time is above a time threshold, but a margin of error associated with the reference voltage is below a voltage threshold. In some examples, the memory device 510 may determine to adjust one or both of the sampling time and the reference voltage based on the determined margins of error. The memory device 510 may perform the determined adjustments by initiating a recalibration procedure associated with the one or more samplers.

At 540, the memory device 510 may transmit feedback to the host device 505 based on sampling the signals. In some examples, the feedback may include the one or more candidate sequences determined by the samplers, to support comparison by the host device 505. Additionally or alternatively, the feedback may be based on the memory device 510 comparing the one or more candidate sequences to the sequence of logic values. For example, the feedback may include an indication of the one or more margins of error or whether they exceed one or more relevant thresholds, an indication of the determined adjustments to one or both of the sampling time and the reference voltage, an indication of the initiated recalibration procedure, an indication of results of the recalibration procedure, or a combination thereof.

In some examples, at 545 the host device 505 may compare the one or more candidate sequences to the sequence of logic values based on the feedback from the memory device 510. In some examples, the host device 505 may determine a margin of error based on comparing the sequences. For example, the host device 505 may compare the values detected at the multiple reference points in the unit interval to an expected value based on the sequence of logic values. In some examples, the host device 505 may make a pass or fail determination for a margin of error based on a threshold. For example, the host device 505 may determine the margin of error is acceptable if the margin of error is above the threshold, or the host device 505 may determine the margin of error is unacceptable if the margin of error is below a threshold.

In some examples, the host device 505 may determine multiple margins of error based on the received candidate sequences (e.g., in multiple domains, directions, or both). For example, the host device 505 may determine a margin of error associated with the sampling time is above a time threshold, but a margin of error associated with the reference voltage is below a voltage threshold. In some examples, the host device 505 may determine to adjust one or both of the sampling time and the reference voltage based on the determined margins of error. The host device 505 may determine to perform the determined adjustments by initiating the recalibration procedure associated with the one or more samplers.

In some examples, at 550 the host device 505 may transmit additional signaling to the memory device 510. In some examples, the signaling may include a command or instructions to initiate the recalibration procedure for performing the determined adjustments. Additionally or alternatively, the signaling may include an indication of the determined adjustments or a new default reference point for the sampler at the memory device 510. In some examples, the signaling may include an acknowledgment or approval message associated with the determined adjustments performed by the memory device 510.

The operations performed by the host device 505 and the memory device 510 may therefore support improvements to data processing operations and, in some examples, may promote improvements to the memory device 510 reliability, among other benefits. While the operations of the process flow are described with reference to a data channel, the operations may be performed to support a link check for any channel 115. Additionally, the roles and the associated operations performed by the host device 505 and the memory device 510 may be reversed. For example, the memory device 510 may transmit signaling including a sequence of logic values to the host device 505, and the host device 505 may sample the signaling to determine a candidate sequence and identify a margin of error.

Figure 6:
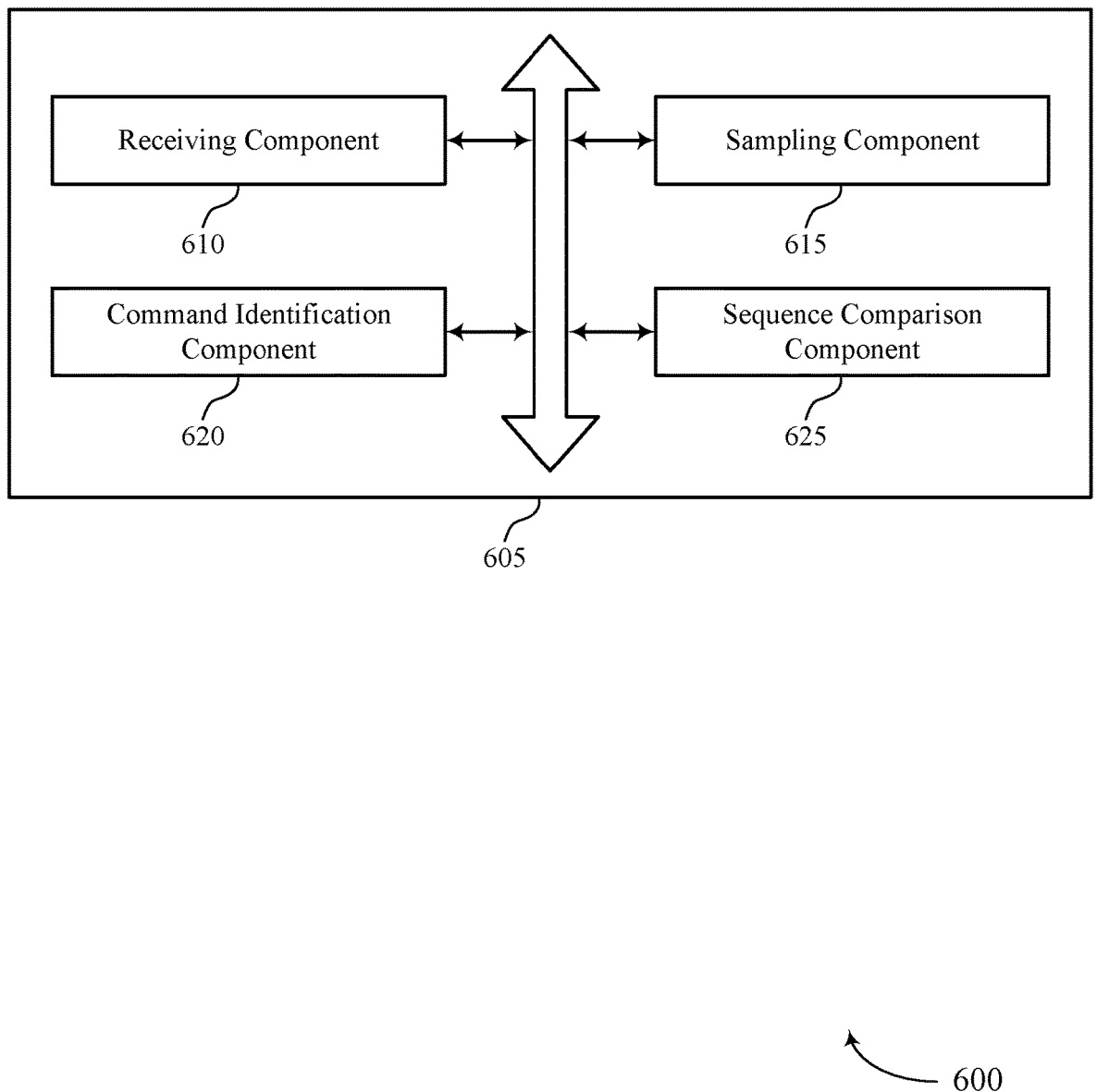
FIG. 6 shows a block diagram of a memory device that supports link evaluation for a memory device in accordance with examples as disclosed herein.

FIG. 6 shows a block diagram 600 of a memory device 605 that supports link evaluation in accordance with examples as disclosed herein. The memory device 605 may be an example of aspects of a memory device as described with reference to FIGS. 1-3 and 5. The memory device 605 may include a receiving component 610, a sampling component 615, a command identification component 620, and a sequence comparison component 625. Each of these modules may communicate, directly or indirectly, with one another (e.g., via one or more buses).

The receiving component 610 may receive, via a channel, first signaling associated with data to store at the memory device. In some examples, the receiving component 610 may receive, via the channel, second signaling associated with a sequence of logic values. In some examples, the receiving component 610 may receive, from the host device before receiving the second signaling, an indication of the sequence of logic values.

The sampling component 615 may sample the first signaling based on a first reference point within a time domain and a voltage domain to obtain the data. In some examples, the sampling component 615 may sample the second signaling based on a second reference point within the time domain and the voltage domain to obtain a candidate sequence of logic values. In some examples, the sampling component 615 may sample the second signaling based on the first reference point to obtain the sequence of logic values.

In some examples, the sampling component 615 may sample the second signaling based on a third reference point in the time domain and the voltage domain to obtain a second candidate sequence of logic values, where the third signaling is based on a comparison of the second candidate sequence to the sequence of logic values. In some examples, the sampling component 615 may sample the second signaling based on the third reference point occurs after sampling the second signaling based on the second reference point. In some examples, the sampling component 615 may sample the second signaling based on the third reference point occurs concurrently with sampling the second signaling based on the second reference point.

In some examples, the sampling component 615 may adjust a time or voltage reference used by a sampler included in the memory device, where the adjusting is after sampling the first signaling and before sampling the second signaling, and where the second reference point corresponds to the adjusted time or voltage reference. In some examples, the sampling component 615 may activate a second sampler included in the memory device after sampling the first signaling, where a first sampler included in the memory device is operable to use the first reference point and the second sampler is operable to use the second reference point.

In some examples, the sampling component 615 may determine, based on the comparison, that a margin of error for the channel is deficient. In some examples, calibrating the sampler based on determining that the margin of error is deficient, where the third signaling includes an indication of the calibration. In some cases, the second reference point is earlier or later within the time domain than the first reference point. In some cases, the second reference point is at a higher or lower voltage within the voltage domain than the first reference point.

The command identification component 620 may identify the second signaling as associated with the sequence of logic values based on a command received by the memory device. In some examples, the command identification component 620 may identify the second signaling as associated with the sequence of logic values is based on a timing relationship between the command being received and the second signaling being received. In some examples, the command identification component 620 may receive, at the memory device, a command to calibrate a sampler for the channel. In some cases, the command includes an auto refresh command.

The sequence comparison component 625 may transmit, by the memory device, third signaling based on a comparison of the candidate sequence of logic values to the sequence of logic values. In some examples, the sequence comparison component 625 may determine a match between the candidate sequence and the sequence. In some examples, the sequence comparison component 625 may determine, based on the match, that a margin of error for the channel is greater than or equal to a difference between the second reference point and the first reference point. In some examples, the sequence comparison component 625 may determine a mismatch between the candidate sequence and the sequence. In some examples, the sequence comparison component 625 may determine, based on the mismatch, that a margin of error for the channel is less than a difference between the second reference point and the first reference point.

Figure 7:
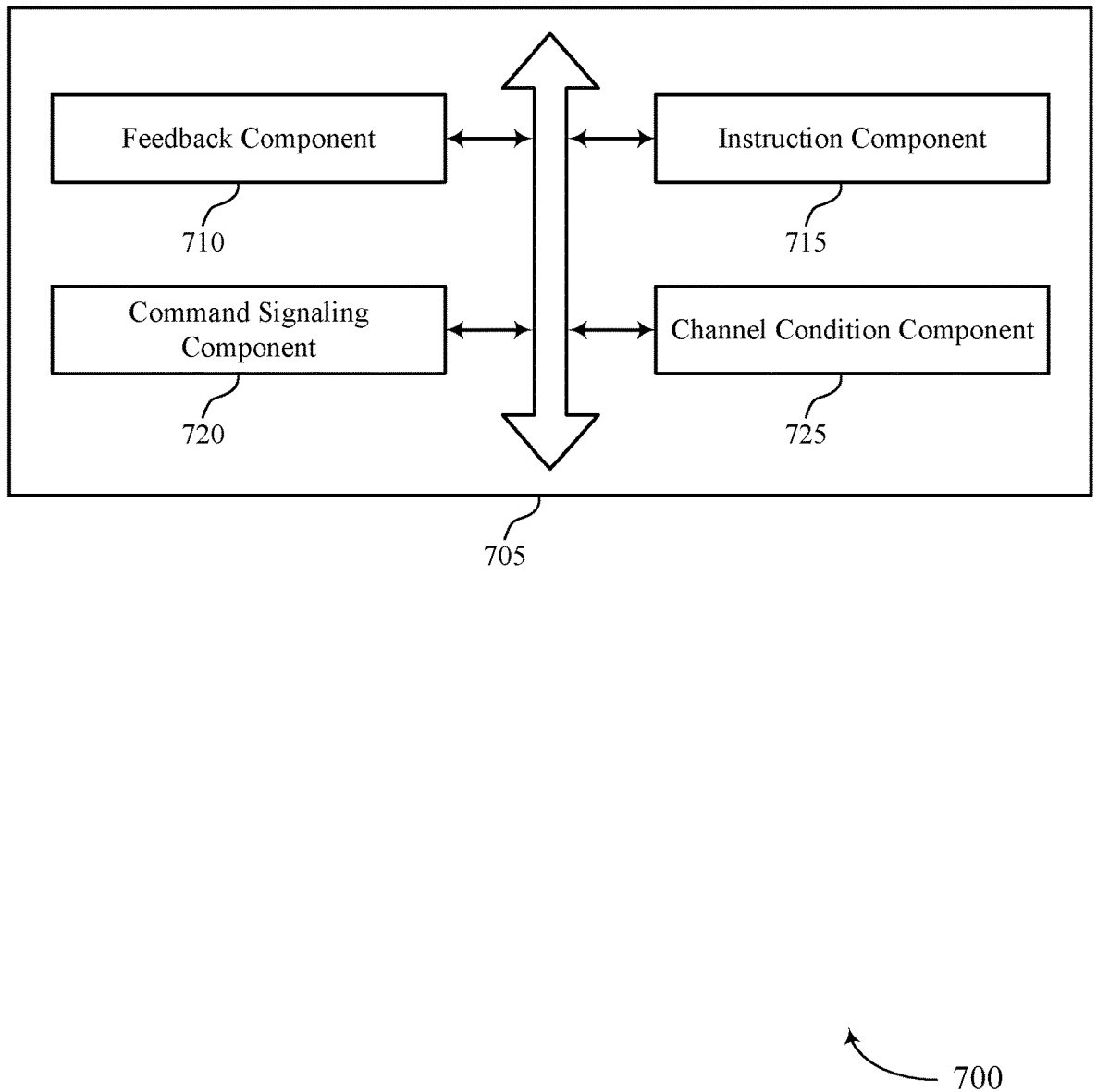
FIG. 7 shows a block diagram of a host device that supports link evaluation for a memory device in accordance with examples as disclosed herein.

FIG. 7 shows a block diagram 700 of a host device 705 that supports link evaluation in accordance with examples as disclosed herein. The host device 705 may be an example of aspects of a host device as described with reference to FIGs. The host device 705 may include a feedback component 710, an instruction component 715, a command signaling component 720, and a channel condition component 725. Each of these modules may communicate, directly or indirectly, with one another (e.g., via one or more buses).

The feedback component 710 may receive feedback from the memory device based on the signaling associated with the sequence of logic values. In some examples, the feedback component 710 may compare the margin of error to a threshold. In some cases, the feedback includes an indication of whether the margin of error is below a threshold.

The instruction component 715 may transmit an instruction to the memory device based on the feedback.

The command signaling component 720 may transmit a command to the memory device that indicates the signaling is associated with the sequence of logic values.

The channel condition component 725 may transmit, to a memory device via a channel, signaling associated with a sequence of logic values, where the signaling supports a determination of a condition of the channel. In some examples, the channel condition component 725 may compare the candidate sequence to the sequence. In some examples, the channel condition component 725 may determine the condition based on the comparing. In some cases, the condition includes a margin of error for the channel in at least one of a time domain or a voltage domain.

Figure 8:
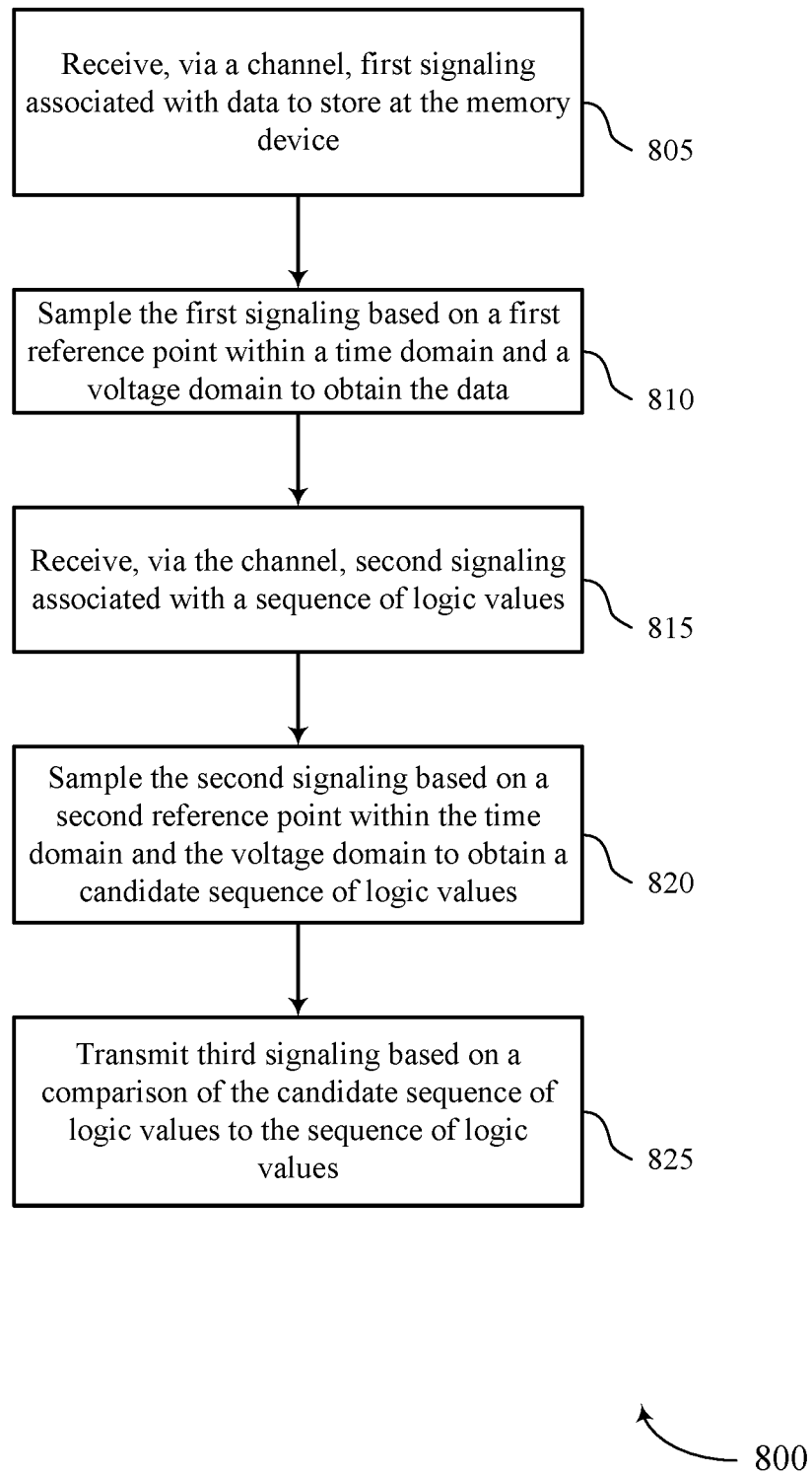
FIGS. 8 through 11 show flowcharts illustrating a method or methods that support link evaluation for a memory device in accordance with examples as disclosed herein.

FIG. 8 shows a flowchart illustrating a method or methods 800 that supports link evaluation in accordance with examples as disclosed herein. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive, via a channel, first signaling associated with data to store at the memory device. The operations of 805 may be performed according to the methods described herein. In some examples, aspects of the operations of 805 may be performed by a receiving component as described with reference to FIG. 6.

At 810, the memory device may sample the first signaling based on a first reference point within a time domain and a voltage domain to obtain the data. The operations of 810 may be performed according to the methods described herein. In some examples, aspects of the operations of 810 may be performed by a sampling component as described with reference to FIG. 6.

At 815, the memory device may receive, via the channel, second signaling associated with a sequence of logic values. The operations of 815 may be performed according to the methods described herein. In some examples, aspects of the operations of 815 may be performed by a receiving component as described with reference to FIG. 6.

At 820, the memory device may sample the second signaling based on a second reference point within the time domain and the voltage domain to obtain a candidate sequence of logic values. The operations of 820 may be performed according to the methods described herein. In some examples, aspects of the operations of 820 may be performed by a sampling component as described with reference to FIG. 6.

At 825, the memory device may transmit third signaling based on a comparison of the candidate sequence of logic values to the sequence of logic values. The operations of 825 may be performed according to the methods described herein. In some examples, aspects of the operations of 825 may be performed by a sequence comparison component as described with reference to FIG. 6.

In some examples, an apparatus as described herein may perform a method or methods, such as the method 800. The apparatus may include features, means, or instructions (e.g., a non-transitory computer-readable medium storing instructions executable by a processor) for receiving, via a channel, first signaling associated with data to store at the memory device, sampling the first signaling based on a first reference point within a time domain and a voltage domain to obtain the data, receiving, at the memory device via the channel, second signaling associated with a sequence of logic values, sampling the second signaling based on a second reference point within the time domain and the voltage domain to obtain a candidate sequence of logic values, and transmitting, by the memory device, third signaling based on a comparison of the candidate sequence of logic values to the sequence of logic values.

Some examples of the method 800 and the apparatus described herein may further include operations, features, means, or instructions for determining a match between the candidate sequence and the sequence, and determining, based on the match, that a margin of error for the channel may be greater than or equal to a difference between the second reference point and the first reference point.

Some examples of the method 800 and the apparatus described herein may further include operations, features, means, or instructions for determining a mismatch between the candidate sequence and the sequence, and determining, based on the mismatch, that a margin of error for the channel may be less than a difference between the second reference point and the first reference point.

Some examples of the method 800 and the apparatus described herein may further include operations, features, means, or instructions for identifying the second signaling as associated with the sequence of logic values based on a command received by the memory device.

Some examples of the method 800 and the apparatus described herein may further include operations, features, means, or instructions for identifying the second signaling as associated with the sequence of logic values may be based on a timing relationship between the command being received and the second signaling being received.

In some examples of the method 800 and the apparatus described herein, the command includes an auto refresh command.

In some examples of the method 800 and the apparatus described herein, the second reference point may be earlier or later within the time domain than the first reference point.

In some examples of the method 800 and the apparatus described herein, the second reference point may be at a higher or lower voltage within the voltage domain than the first reference point.

Some examples of the method 800 and the apparatus described herein may further include operations, features, means, or instructions for receiving, from the host device before receiving the second signaling, an indication of the sequence of logic values.

Some examples of the method 800 and the apparatus described herein may further include operations, features, means, or instructions for sampling the second signaling based on the first reference point to obtain the sequence of logic values.

Some examples of the method 800 and the apparatus described herein may further include operations, features, means, or instructions for sampling the second signaling based on a third reference point in the time domain and the voltage domain to obtain a second candidate sequence of logic values, where the third signaling may be based on a comparison of the second candidate sequence to the sequence of logic values.

Some examples of the method 800 and the apparatus described herein may further include operations, features, means, or instructions for sampling the second signaling based on the third reference point occurs after sampling the second signaling based on the second reference point.

Some examples of the method 800 and the apparatus described herein may further include operations, features, means, or instructions for sampling the second signaling based on the third reference point occurs concurrently with sampling the second signaling based on the second reference point.

Some examples of the method 800 and the apparatus described herein may further include operations, features, means, or instructions for adjusting a time or voltage reference used by a sampler included in the memory device, where the adjusting may be after sampling the first signaling and before sampling the second signaling, and where the second reference point corresponds to the adjusted time or voltage reference.

Some examples of the method 800 and the apparatus described herein may further include operations, features, means, or instructions for activating a second sampler included in the memory device after sampling the first signaling, where a first sampler included in the memory device may be operable to use the first reference point and the second sampler may be operable to use the second reference point.

In some examples of the method 800 and the apparatus described herein, the third signaling may include operations, features, means, or instructions for receiving, at the memory device, a command to calibrate a sampler for the channel.

Some examples of the method 800 and the apparatus described herein may further include operations, features, means, or instructions for determining, based on the comparison, that a margin of error for the channel may be deficient, and calibrating the sampler based on determining that the margin of error may be deficient, where the third signaling includes an indication of the calibration.

Figure 9:
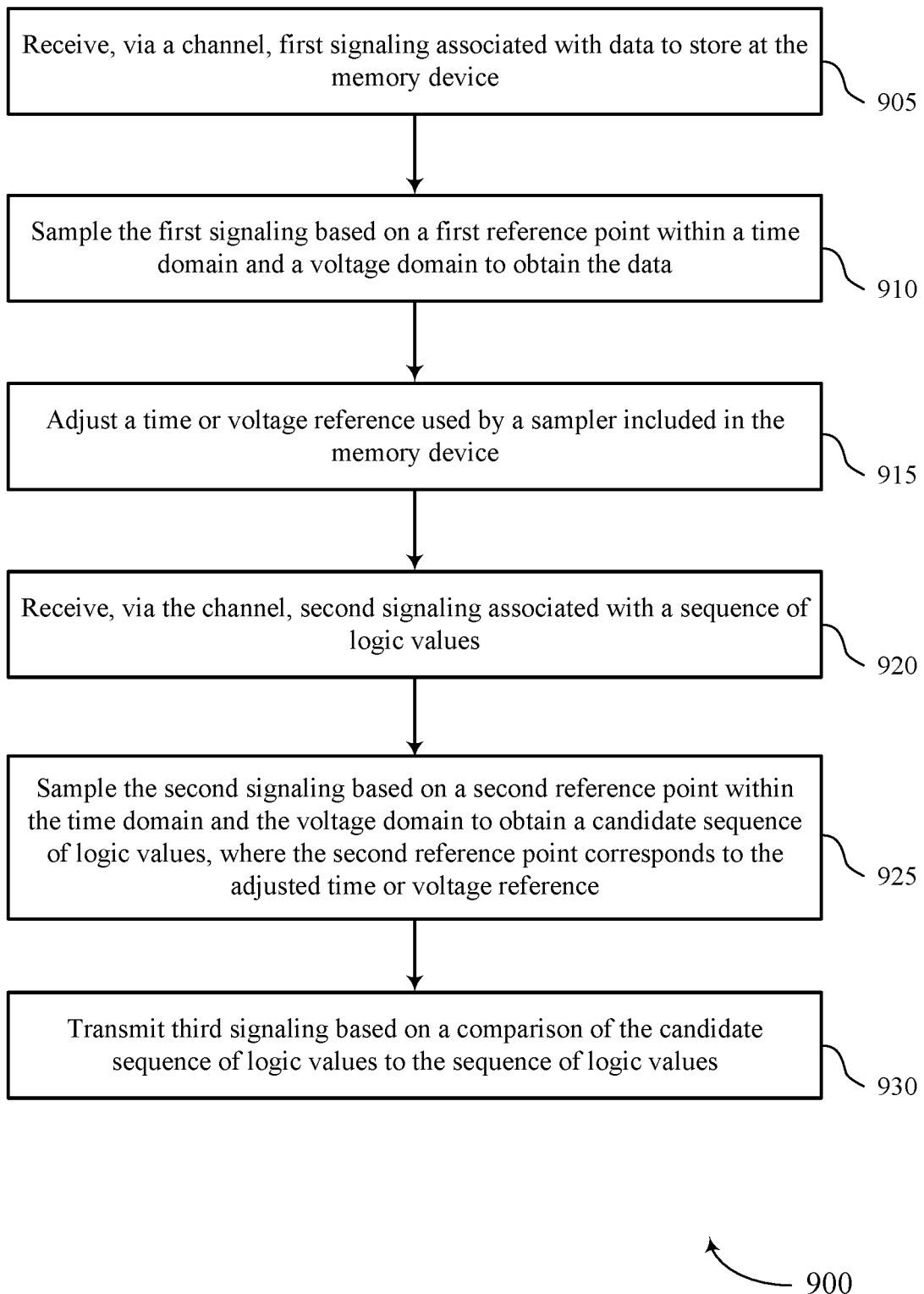

FIG. 9 shows a flowchart illustrating a method or methods 900 that supports link evaluation in accordance with examples as disclosed herein. The operations of method 900 may be implemented by a memory device or its components as described herein. For example, the operations of method 900 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 905, the memory device may receive, via a channel, first signaling associated with data to store at the memory device. The operations of 905 may be performed according to the methods described herein. In some examples, aspects of the operations of 905 may be performed by a receiving component as described with reference to FIG. 6.

At 910, the memory device may sample the first signaling based on a first reference point within a time domain and a voltage domain to obtain the data. The operations of 910 may be performed according to the methods described herein. In some examples, aspects of the operations of 910 may be performed by a sampling component as described with reference to FIG. 6.

At 915, the memory device may adjust a time or voltage reference used by a sampler included in the memory device. The operations of 915 may be performed according to the methods described herein. In some examples, aspects of the operations of 915 may be performed by a sampling component as described with reference to FIG. 6.

At 920, the memory device may receive, via the channel, second signaling associated with a sequence of logic values. The operations of 920 may be performed according to the methods described herein. In some examples, aspects of the operations of 920 may be performed by a receiving component as described with reference to FIG. 6.

At 925, the memory device may sample the second signaling based on a second reference point within the time domain and the voltage domain to obtain a candidate sequence of logic values, where the second reference point corresponds to the adjusted time or voltage reference. The operations of 925 may be performed according to the methods described herein. In some examples, aspects of the operations of 925 may be performed by a sampling component as described with reference to FIG. 6.

At 930, the memory device may transmit third signaling based on a comparison of the candidate sequence of logic values to the sequence of logic values. The operations of 930 may be performed according to the methods described herein. In some examples, aspects of the operations of 930 may be performed by a sequence comparison component as described with reference to FIG. 6.

Figure 10:
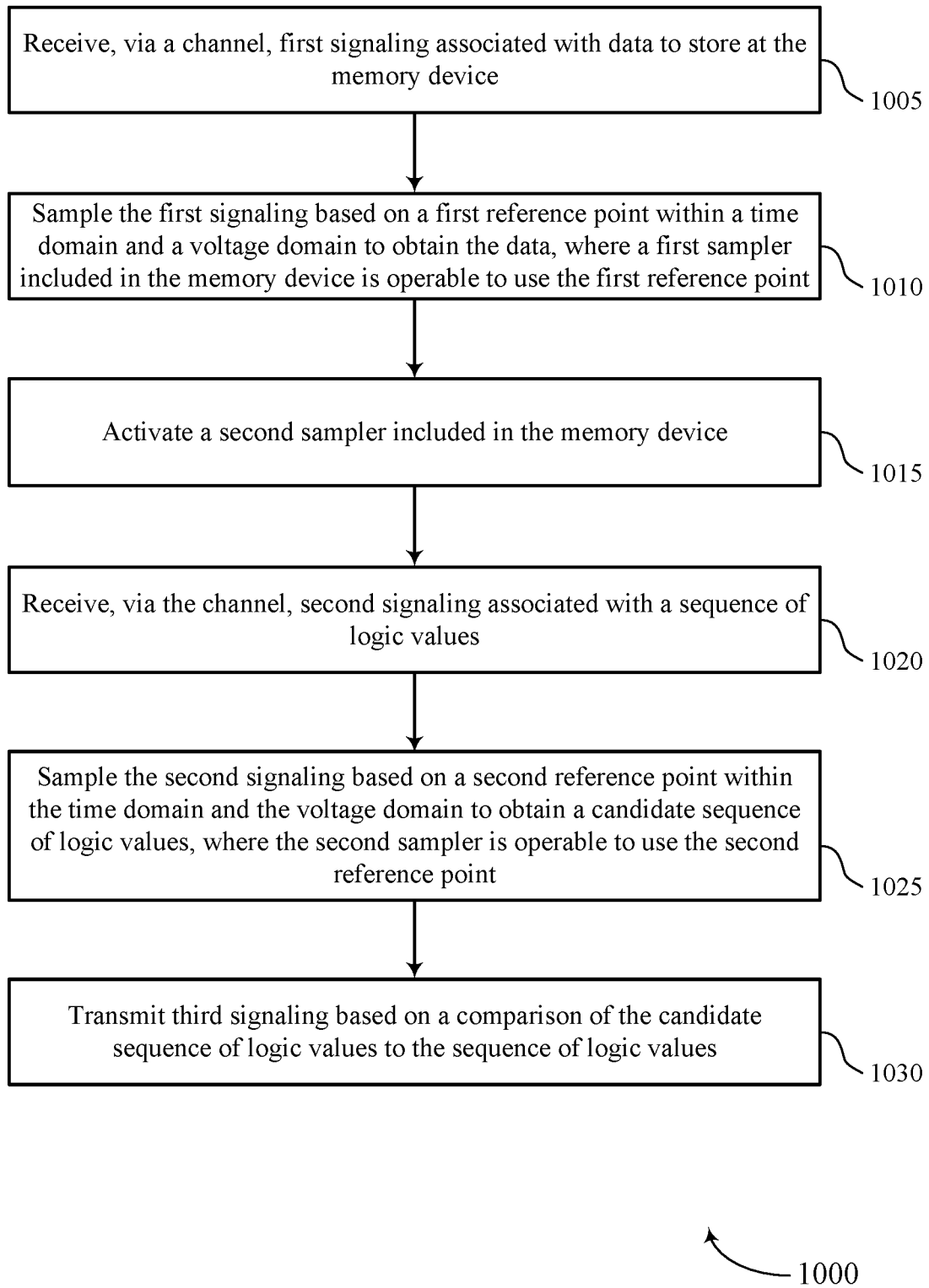

FIG. 10 shows a flowchart illustrating a method or methods 1000 that supports link evaluation in accordance with examples as disclosed herein. The operations of method 1000 may be implemented by a memory device or its components as described herein. For example, the operations of method 1000 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 1005, the memory device may receive, via a channel, first signaling associated with data to store at the memory device. The operations of 1005 may be performed according to the methods described herein. In some examples, aspects of the operations of 1005 may be performed by a receiving component as described with reference to FIG. 6.

At 1010, the memory device may sample the first signaling based on a first reference point within a time domain and a voltage domain to obtain the data, where a first sampler included in the memory device is operable to use the first reference point. The operations of 1010 may be performed according to the methods described herein. In some examples, aspects of the operations of 1010 may be performed by a sampling component as described with reference to FIG. 6.

At 1015, the memory device may activate a second sampler included in the memory device. The operations of 1015 may be performed according to the methods described herein. In some examples, aspects of the operations of 1015 may be performed by a sampling component as described with reference to FIG. 6.

At 1020, the memory device may receive, via the channel, second signaling associated with a sequence of logic values. The operations of 1020 may be performed according to the methods described herein. In some examples, aspects of the operations of 1020 may be performed by a receiving component as described with reference to FIG. 6.

At 1025, the memory device may sample the second signaling based on a second reference point within the time domain and the voltage domain to obtain a candidate sequence of logic values, where the second sampler is operable to use the second reference point. The operations of 1025 may be performed according to the methods described herein. In some examples, aspects of the operations of 1025 may be performed by a sampling component as described with reference to FIG. 6.

At 1030, the memory device may transmit third signaling based on a comparison of the candidate sequence of logic values to the sequence of logic values. The operations of 1030 may be performed according to the methods described herein. In some examples, aspects of the operations of 1030 may be performed by a sequence comparison component as described with reference to FIG. 6.

Figure 11:
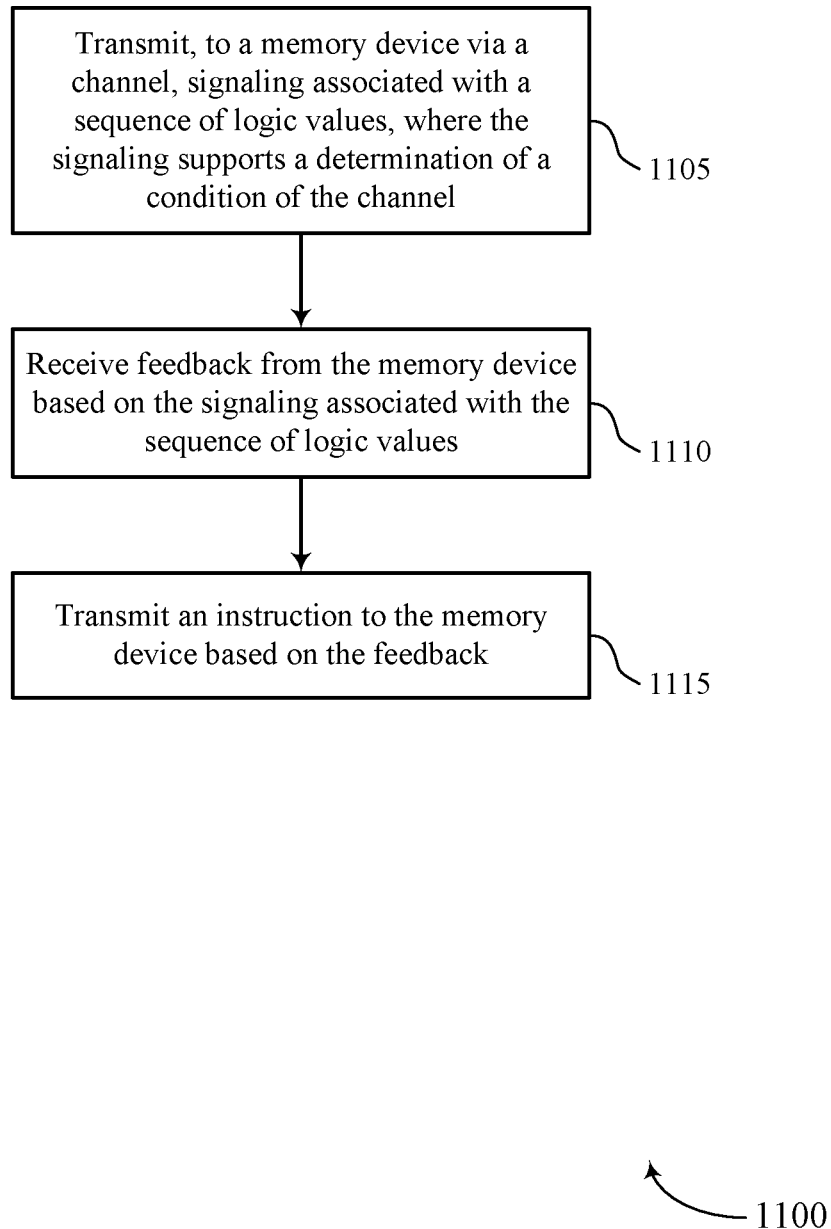

FIG. 11 shows a flowchart illustrating a method or methods 1100 that supports link evaluation in accordance with examples as disclosed herein. The operations of method 1100 may be implemented by a host device or its components as described herein. For example, the operations of method 1100 may be performed by a host device as described with reference to FIG. 7. In some examples, a host device may execute a set of instructions to control the functional elements of the host device to perform the described functions. Additionally or alternatively, a host device may perform aspects of the described functions using special-purpose hardware.

At 1105, the host device may transmit, to a memory device via a channel, signaling associated with a sequence of logic values, where the signaling supports a determination of a condition of the channel. The operations of 1105 may be performed according to the methods described herein. In some examples, aspects of the operations of 1105 may be performed by a channel condition component as described with reference to FIG. 7.

At 1110, the host device may receive feedback from the memory device based on the signaling associated with the sequence of logic values. The operations of 1110 may be performed according to the methods described herein. In some examples, aspects of the operations of 1110 may be performed by a feedback component as described with reference to FIG. 7.

At 1115, the host device may transmit an instruction to the memory device based on the feedback. The operations of 1115 may be performed according to the methods described herein. In some examples, aspects of the operations of 1115 may be performed by an instruction component as described with reference to FIG. 7.

In some examples, an apparatus as described herein may perform a method or methods, such as the method 1100. The apparatus may include features, means, or instructions (e.g., a non-transitory computer-readable medium storing instructions executable by a processor) for transmitting, to a memory device via a channel, signaling associated with a sequence of logic values, where the signaling supports a determination of a condition of the channel, receiving feedback from the memory device based on the signaling associated with the sequence of logic values, and transmitting an instruction to the memory device based on the feedback.

Some examples of the method 1100 and the apparatus described herein may further include operations, features, means, or instructions for transmitting a command to the memory device that indicates the signaling may be associated with the sequence of logic values.

In some examples of the method 1100 and the apparatus described herein, the condition includes a margin of error for the channel in at least one of a time domain or a voltage domain.

In some examples of the method 1100 and the apparatus described herein, the feedback includes an indication of whether the margin of error may be below a threshold.

In some examples of the method 1100 and the apparatus described herein, the feedback may include operations, features, means, or instructions for comparing the margin of error to a threshold.

In some examples of the method 1100 and the apparatus described herein, the feedback may include operations, features, means, or instructions for comparing the candidate sequence to the sequence, and determining the condition based on the comparing.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells operable to store data, a channel operable to exchange data between the array of memory cells and a host device for the apparatus, one or more samplers coupled with the channel and operable to determine logic values based on signals received via the channel, where at least one of the one or more samplers is operable to use a default reference point in a time domain and in a voltage domain, and a controller coupled with the array of memory cells, the channel, and the one or more samplers, the controller operable to cause the apparatus to receive, via the channel, signaling including a sequence of logic values determine, using the one or more samplers, a candidate sequence of logic values based on the signaling and a second reference point in the time domain and the voltage domain, and transmit feedback to the host device based on a comparison of the candidate sequence to the sequence.

In some examples of the apparatus, the one or more samplers may include a first sampler operable to determine logic values using the default reference point, a second sampler operable to determine logic values using the second reference point. In some examples of the apparatus, the second reference point may be at a different time within the time domain than the default reference point, and the second reference point may be at a different voltage within the voltage domain than the default reference point.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    sampling, at a first device, a first signaling received via a channel based at least in part on a first reference point within a time domain and a voltage domain to obtain data associated with the first signaling, wherein the first reference point is at a first sampling time within a sample period;
    sampling, at the first device, a second signaling received via the channel and associated with a first sequence of logic values based at least in part on a second reference point within the time domain and the voltage domain to obtain a second sequence of logic values, wherein the second reference point is at a second sampling time within the sample period; and
    transmitting, by the first device, a third signaling based at least in part on the second sequence of logic values and the first sequence of logic values.

2. The method of claim 1, further comprising:
    determining a match between the second sequence of logic values and the first sequence of logic values; and
    determining, based at least in part on the match, that a margin of error for the channel is greater than or equal to a difference between the second reference point and the first reference point.

3. The method of claim 1, further comprising:
    determining a mismatch between the second sequence of logic values and the first sequence of logic values; and
    determining, based at least in part on the mismatch, that a margin of error for the channel is less than a difference between the second reference point and the first reference point.

4. The method of claim 1, further comprising:
    identifying the second signaling as associated with the first sequence of logic values based at least in part on a timing relationship between a command received by the first device and the second signaling being received.

5. The method of claim 1, wherein the second reference point is at a different time within the time domain than the first reference point.

6. The method of claim 1, wherein the second reference point is at a different voltage within the voltage domain than the first reference point.

7. The method of claim 1, further comprising:
    receiving, from a second device before determining the second sequence of logic values, an indication of the first sequence of logic values.

8. The method of claim 1, further comprising:
    sampling the second signaling based at least in part on the first reference point to obtain the first sequence of logic values.

9. The method of claim 1, further comprising:
    sampling the second signaling based at least in part on a third reference point in the time domain and the voltage domain to obtain a third sequence of logic values, wherein the third signaling is based at least in part on a comparison of the third sequence to the first sequence of logic values.

10. The method of claim 9, wherein sampling the second signaling based at least in part on the third reference point occurs after sampling the second signaling based at least in part on the second reference point.

11. The method of claim 9, wherein sampling the second signaling based at least in part on the third reference point occurs concurrently with sampling the second signaling based at least in part on the second reference point.

12. The method of claim 1, further comprising:
adjusting a time or voltage reference used by a sampler included in the first device, wherein the adjusting is after sampling the first signaling and before sampling the second signaling, and wherein the second reference point corresponds to the adjusted time or the adjusted voltage reference.

13. The method of claim 1, further comprising:
activating a second sampler included in the first device after sampling the first signaling, wherein a first sampler included in the first device is operable to use the first reference point and the second sampler is operable to use the second reference point.

14. The method of claim 1, further comprising:
calibrating a sampler included in the memory first device based at least in part on determining that a margin of error for a channel operable to exchange data with the first device is deficient, wherein the third signaling comprises an indication of the calibration.

15. An apparatus, comprising:
a channel operable to exchange data between an array of memory cells and a second device for the apparatus;
one or more samplers coupled with the channel and operable to determine logic values based at least in part on first signaling received via the channel, wherein at least one of the one or more samplers is operable to use a first reference point in a time domain and in a voltage domain to obtain data associated with the first signaling, and wherein the first reference point is at a first sampling time within a sample period; and
a controller operable to cause the apparatus to:
determine, using the one or more samplers, a second sequence of logic values based at least in part on second signaling received via the channel and a second reference point in the time domain and the voltage domain, wherein the second signaling comprises a first sequence of logic values, and wherein the second reference point is at a second sampling time within the sample period; and
transmit feedback to the second device based at least in part on the second sequence of logic values and the first sequence of logic values.

16. The apparatus of claim 15, wherein the one or more samplers comprise:
a first sampler operable to determine logic values using the first reference point; and
a second sampler operable to determine logic values using the second reference point.

17. The apparatus of claim 15, wherein:
the second reference point is at a different time within the time domain than the first reference point; and
the second reference point is at a different voltage in the voltage domain than the first reference point.

18. The apparatus of claim 15, wherein the controller is further operable to cause the apparatus to:
determine, using the one or more samplers, a third sequence of logic values based at least in part on the second signaling and a third reference point in the time domain and the voltage domain, wherein the feedback is based at least in part on a comparison of the third sequence to the first sequence of logic values.

19. The apparatus of claim 15, wherein the controller is further operable to cause the apparatus to:
adjust a time or voltage reference used by the one or more samplers, wherein the time or voltage reference is adjusted after sampling the first signaling and before sampling the second signaling, and wherein the second reference point corresponds to the adjusted time or the adjusted voltage reference.

20. A non-transitory computer-readable medium storing code, the code comprising instructions executable by an electronic device to:
sample, at a first device, a first signaling based at least in part on a first reference point within a time domain and a voltage domain to obtain data associated with the first signaling, wherein the first reference point is at a first sampling time within a sample period;
sample, at the first device, a second signaling associated with a first sequence of logic values based at least in part on a second reference point within the time domain and the voltage domain to obtain a second sequence of logic values, wherein the second reference point is at a second sampling time within the sample period; and
transmit, by the first device, a third signaling based at least in part on the second sequence of logic values and the first sequence of logic values.

* * * * *